(12) United States Patent
Tanaka

(10) Patent No.: US 7,060,911 B2
(45) Date of Patent: Jun. 13, 2006

(54) CONDUCTOR STRIP FORMED WITH SLIT, CUTOUT OR GROOVES

(75) Inventor: Naoya Tanaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 13 days.

(21) Appl. No.: 10/916,002

(22) Filed: Aug. 11, 2004

(65) Prior Publication Data

US 2005/0009416 A1    Jan. 13, 2005

Related U.S. Application Data

(63) Continuation of application No. 10/206,275, filed on Jul. 26, 2002, now Pat. No. 6,794,584.

(30) Foreign Application Priority Data

Jul. 31, 2001  (JP)  ............................... 2001-231514
Apr. 30, 2002  (JP)  ............................... 2002-128694

(51) Int. Cl.
*H05K 1/11*    (2006.01)
*H01R 12/04*   (2006.01)

(52) U.S. Cl. ...................................... 174/261; 174/260

(58) Field of Classification Search ................ 174/250, 174/260, 261, 138 G, 59, 94 R, 84 R, 268; 361/760, 777, 773, 772, 802; 439/83, 876
See application file for complete search history.

(56) References Cited

U.S. PATENT DOCUMENTS

| | | | | |
|---|---|---|---|---|
| 3,238,421 | A | * | 3/1966 | Patrick ........................ 361/809 |
| 4,332,430 | A | * | 6/1982 | Clark ........................... 439/83 |
| 4,619,487 | A | * | 10/1986 | Brush, Jr. ..................... 439/98 |
| 4,907,991 | A | | 3/1990 | Kobayashi |
| 4,991,059 | A | | 2/1991 | Kiyose |
| 5,631,806 | A | | 5/1997 | Fried et al. |
| 6,115,262 | A | | 9/2000 | Brunner et al. |
| 6,151,221 | A | | 11/2000 | Van Lerberghe |
| 6,175,086 | B1 | | 1/2001 | Nakamura |
| 6,593,526 | B1 | | 7/2003 | Takeda |
| 2002/0038723 | A1 | * | 4/2002 | Takeda ........................ 174/260 |

* cited by examiner

*Primary Examiner*—Kamand Cuneo
*Assistant Examiner*—I B Patel
(74) *Attorney, Agent, or Firm*—Hamre, Schumann, Mueller & Larson, P.C.

(57) ABSTRACT

A conductor strip includes a first end portion soldered to a printed circuit board, and a second end portion welded to a rechargeable battery. The conductor strip also includes a connecting portion disposed between the first and the second end portions. The connecting portion has a smaller width than that of the first end portion so that the peeling force acting on the first end portion is alleviated.

2 Claims, 17 Drawing Sheets

CONDUCTOR STRIP FORMED WITH SLIT, CUTOUT OR GROOVES

This application is a divisional of application Ser. No. 10/206,275, filed 26 Jul. 2002 now U.S. Pat. No. 6,794,584, entitled CONDUCTOR STRIP FORMED WITH SLIT, CUTOUT OR GROOVES, which application(s) are incorporated herein by reference.

BACKGROUND OF THE INVENTION

1. Field of the Invention

The present invention relates to a conductor strip used for making an electrical connection between a printed circuit and a battery. It also relates to a connecting arrangement of such a conductor strip and a circuit board.

2. Description of the Related Art

Recently portable electronic devices including notebook computers, cell phones, etc., have been widely used because of their handiness. For enabling outside use, the cell phone for example operates on a rechargeable battery housed in a battery pack together with other necessary components. The battery pack, readily detachable for exchange of the battery, includes a battery cell and a protection unit connected to the cell for preventing the cell from over-discharging or being overcharged.

FIG. 16 shows some aspects of a conventional protection unit $U_O$ of the above type. As illustrated, the conventional unit $U_O$, used for a rechargeable battery cell 100, includes a printed circuit board 200, electronic components 300 mounted on the board 200, and two conductor strips 400 connected to the battery cell 100. Each of the conductor strips 400 includes a rectangular connecting portion 400a and another rectangular connecting portion 400b. The first connecting portion 400a is soldered to a pad (not shown) provided on the board 200, while the second connecting portion 400b is welded to the cathode or anode (not shown) of the cell 100. The conductor strip 400 is bent so that the second connecting portion 400b is perpendicular to the first connecting portion 400a.

While the conventional conductor strip 400 has a simple configuration and thus can be made easily, it entails the following drawbacks.

As seen from FIG. 16, the first connecting portion 400a of the conventional strip 400 does not have any holes or gaps in it. Thus, it is impossible to observe the bonding condition of the solder after the applied solder hardens between the connecting portion 400a and the board 200. Another problem is that the conductor strip 400 is detached from the board 200 rather easily, due to its simple structure, upon exertion of an upward force on the second portion 400b.

SUMMARY OF THE INVENTION

The present invention has been proposed under the circumstances described above. It is, therefore, an object of the present invention to provide a conductor strip that can be firmly attached to a printed circuit board and also permits easy inspection of the solder-bonding condition.

According to a first aspect of the present invention, there is provided a conductor strip comprising: a first end portion fixed to a first member; a second end portion fixed to a second member; and a connector arranged between the first end portion and the second end portion. The connector is smaller in size than the first end portion in a width direction perpendicular to another direction connecting the first end portion and the second end portion.

Preferably, the connector may extend from a central part of the first end portion.

Preferably, the conductor strip may further comprise a projection disposed adjacent to the connector, wherein the projection extends from the first end portion toward the second end portion.

Preferably, the connector may comprise two connecting portions spaced from each other in the width direction.

Preferably, a U-shaped slit may be formed in the conductor strip.

Preferably, the first end portion may be soldered to the first member. The second end portion may be welded to the second member.

According to a second aspect of the present invention, there is provided a conductor strip that comprises: a first end portion fixed to a first member; and a second end portion fixed to a second member. The first end portion is formed with a plurality of grooves for improving the bonding strength of solder material applied between the first end portion and the first member.

Preferably, each of the grooves may have a triangular cross section.

Preferably, the plurality of grooves may comprise grooves that perpendicularly intersect each other.

According to a third aspect of the present invention, there is provided an assembly that comprises: a conductor strip that includes a first end portion, a second end portion, and a connector disposed between the first and the second end portions; and a substrate that supports the conductor strip. The connector is smaller in width than the first end portion.

Preferably, the connector may at least partially project from the substrate.

According to a fourth aspect of the present invention, there is provided a method of soldering a conductor strip to a supporting member, wherein the conductor strip is formed with a U-shaped slit. The method comprises the steps of: applying solder paste to the supporting member in a manner such that a solder-void region is formed on the supporting member; positioning the conductor strip on the supporting member; and melting the applied solder paste. The conductor strip is positioned on the supporting member so that the U-shaped slit exposes the solder-void region.

Other features and advantages of the present invention will become apparent from the detailed description given below with reference to the accompanying drawings.

DETAILED DESCRIPTION OF THE PREFERRED EMBODIMENTS

Preferred embodiments of the present invention will be described below with reference to the accompanying drawings. Throughout these figures, similar or identical elements are indicated by the same reference signs.

Figure 1A:
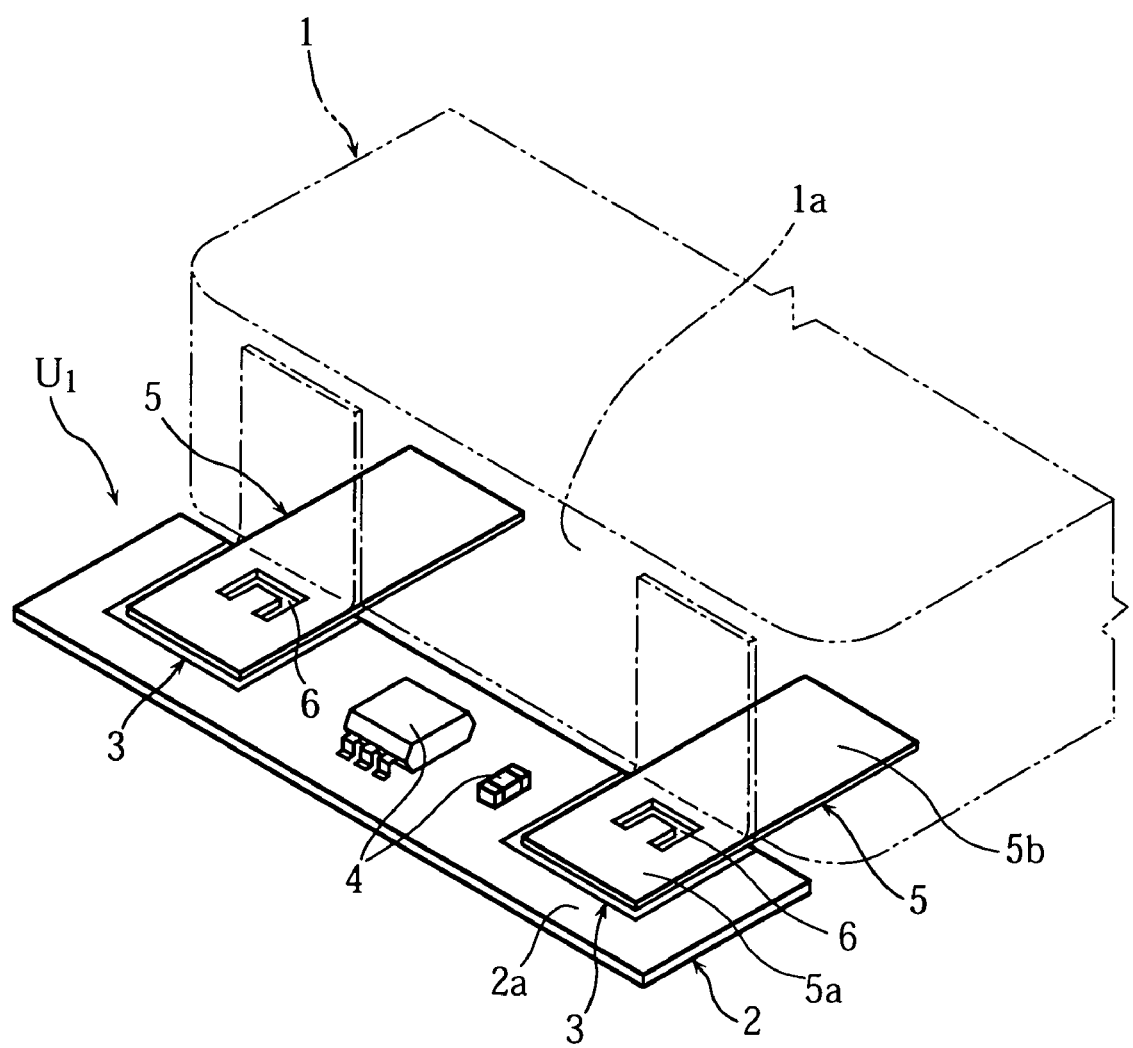
FIG. 1A is a perspective view showing the principal features of a battery pack incorporating conductor strips provided by the present invention.

FIG. 1A shows the principal components of a battery pack utilizing conductor strips provided by the present invention. The battery pack may be used as a power source for a cell phone, notebook computer, etc. As illustrated, the battery pack includes a rechargeable battery cell 1 and a protection unit U1. The cell 1 has a side surface 1a in which a cathode and an anode (not shown) are provided. The protection unit U1 is connected to the cell 1 for preventing the cell 1 from over-discharging or being overcharged. The unit U1 includes an insulating substrate 2, pads 3 formed on the substrate 2, electronic devices 4 mounted on the substrate 2, and two conductor strips 5.

The substrate 2, made of e.g. a glass-fabric-based epoxy resin, has an upper surface 2a upon which a wiring pattern (not shown) is formed of copper. The wiring pattern is connected to the electronic devices 4 and the pads 3. Each of the conductor strips 5 has a first terminal 5a connected to the pad 3 and a second terminal 5b connected to the cathode or anode of the battery cell 1. The strip 5 may initially be flat as a whole, but be bent to be connected to the cell 1, as shown in FIG. 1A.

Figure 1B:
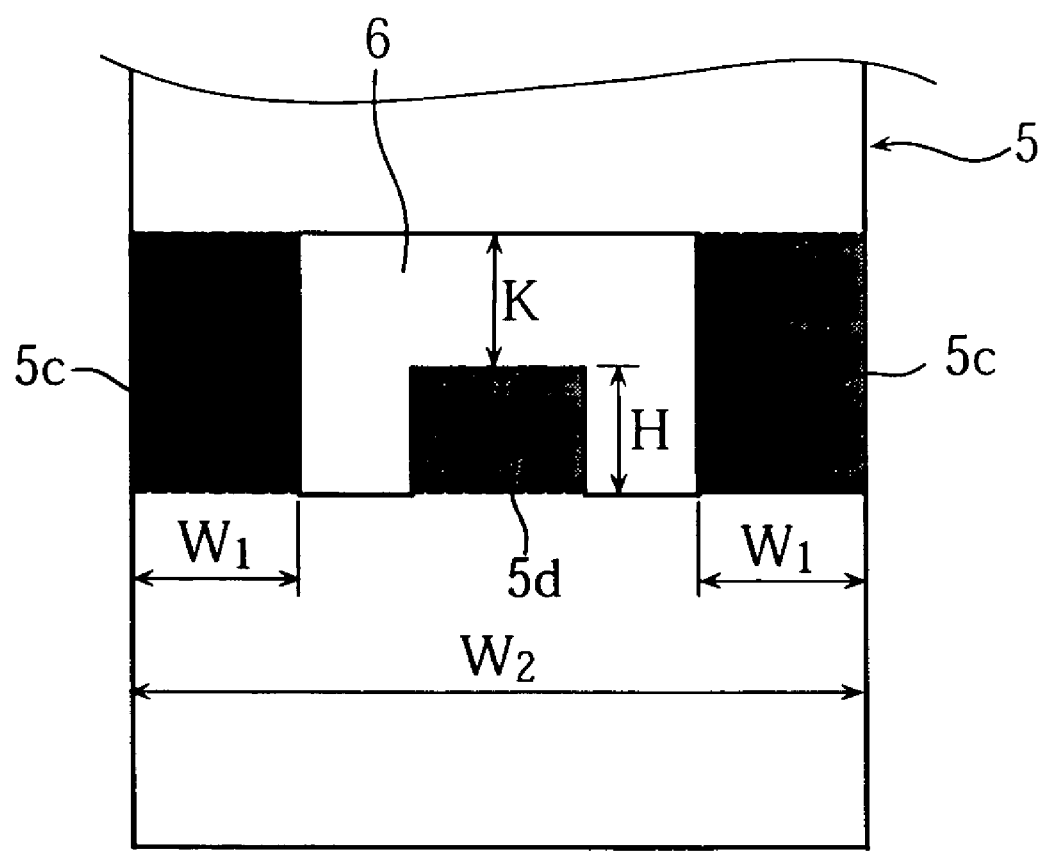
FIG. 1B is a plan view showing the principal part of the conductor strip of the present invention.

In the illustrated embodiment, a staple-shaped (U-shaped) slit 6 (K=0.4 mm) is formed in the first terminal 5a of each strip 5, whereby the strip 5 is provided, as shown in FIG. 1B, with two connecting portions 5c and a rectangular projection 5d (H=0.5 mm) disposed between the connecting portions 5c. The width $W_1$ of each connecting portion 5c is smaller than the width $W_2$ (=2.5 mm) of the conductor strip 5. The technical significances of the slit 6 will be described later.

Figure 2A:
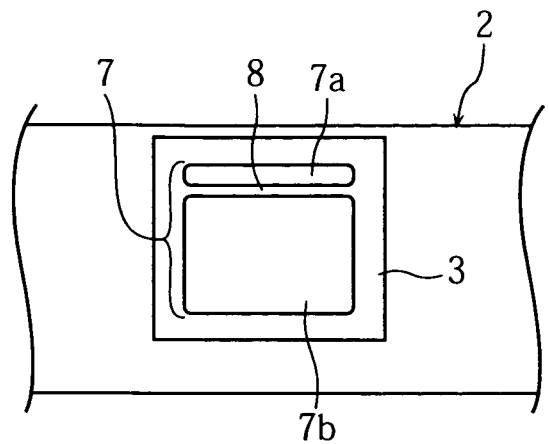
FIGS. 2A~2C illustrate how the conductor strip of the present invention is soldered to a pad.

The first terminal 5a of each strip 5 is soldered to the pad 3 in the following manner. First, as shown in FIG. 2A, solder paste is applied to the pad 3 to form a narrow paste land (first land) 7a and a larger, rectangular paste land (second land) 7b spaced from the first land 7a by a prescribed short distance. A linear region 8 is between the two lands 7a and 7b, which is left uncovered by the solder paste. The application of the solder paste may be performed by using a mask formed with openings corresponding to the first and the second lands 7a, 7b. The mask is laid on the pad 3, and then solder paste is spread over the mask with a squeegee.

Figure 2B:
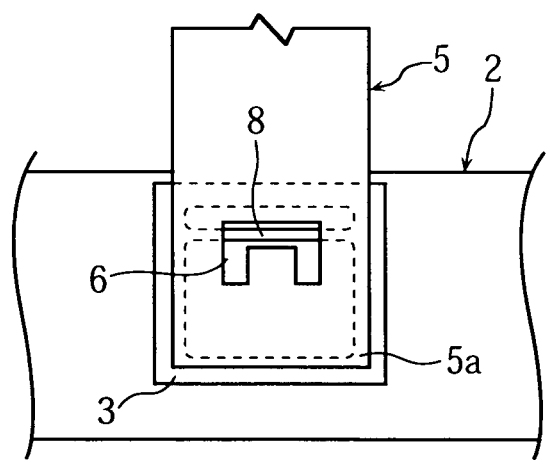
Figure 2C:
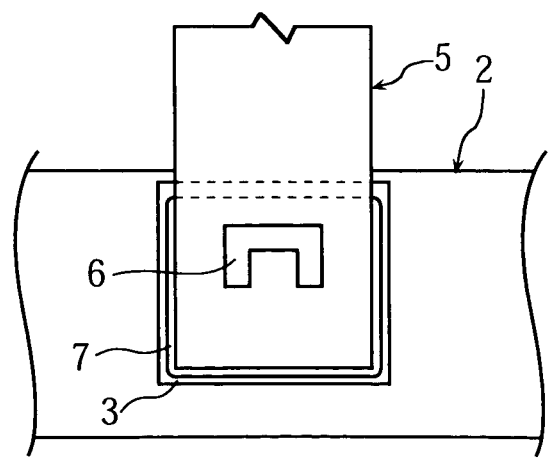

As shown in FIG. 2B, the conductor strip 5 is placed on the pad 3 so that a part of the solder-void region 8 is observed through the slit 6. The strip 5 may be automatically set into place with the use of a suction collet. Then, the substrate 2 together with the strips 5 (the "strip-substrate assembly" below) is heated in a furnace to melt the applied solder paste 7. The molten solder material is spread over the pad 3 under the weight of the conductive strip 5. Then, the strip-substrate assembly is taken out of the furnace to allow the solder material to cool. Subsequently, the solder solidifies, to secure the strip 5 to the pad 3.

For fixing the strip 5 to the pad 3 properly, the molten solder needs to be spread uniformly between the first terminal 5a and the pad 3. When this ideal condition is attained, the first terminal 5a as a whole will be fixed to the pad 3 after the strip-substrate assembly is brought out from the furnace.

Advantageously, the slit 6 formed in the first terminal 5a enables ready inspection of whether the soldering has been performed properly or not. Specifically, when the molten solder is spread uniformly between the first terminal 5a and the pad 3, the linear region 8 will disappear. When the solder has failed to be spread properly, on the other hand, the linear region 8 will remain partially or entirely. In the illustrate embodiment, the remaining or disappearing of the region 8 can be simply observed through the slit 6.

Figure 3:
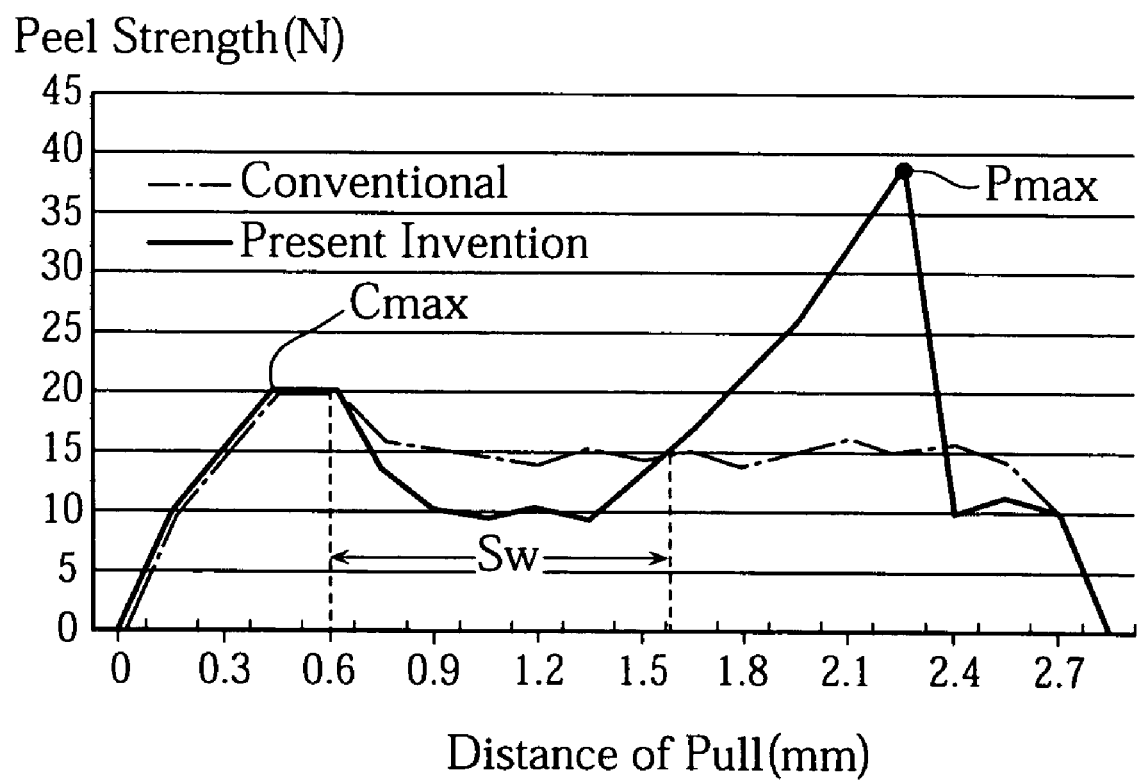
FIG. 3 is the graph showing the relation between the peel strength and the distance of pull regarding a conventional conductor strip and the conductor strip of the present invention.
Figure 16:
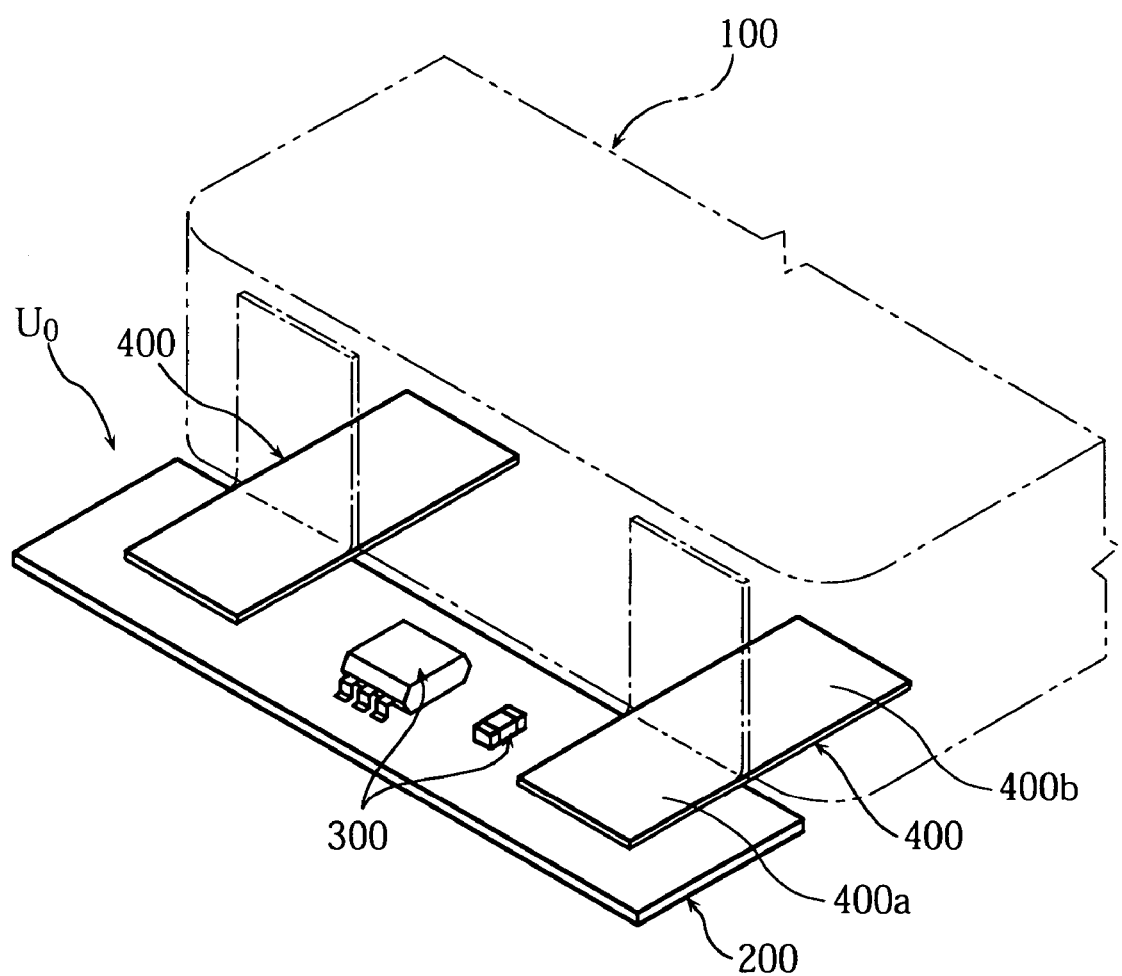
FIG. 16 shows the principal features of a conventional battery pack.

In addition to the above advantage, the slit 6 contributes to the improvement in peel strength of the conductor strip 5. Referring to FIG. 3, the graph shows the relation between the 'peel strength' and the 'distance of pull' ("PS-DP relation" below) with respect to the conventional strip 400 (FIG. 16) and the strip 5 of the present invention. The 'distance of pull' indicates how much the second terminal 5b or 400b is pulled upward (see FIGS. 4A and 4B). The graph of FIG. 3 shows that the maximum peel strength Cmax of the conventional strip 400 is about 20 N(newton), whereas the maximum peel strength Pmax of the strip 5 of the present invention is nearly 40 N. The reason why the peel strength Pmax of the strip 5 is greater than the peel strength Cmax of the conventional strip 400 is as follows. As seen from FIG. 16, the first terminal 400a of the conventional strip 400 is a simple rectangular plate provided with no countermeasure to resist the peeling force. Thus, as the graph of FIG. 3 shows, the peel strength of the conventional strip is relatively low after the maximum peel strength Cmax is attained.

Figure 4A:
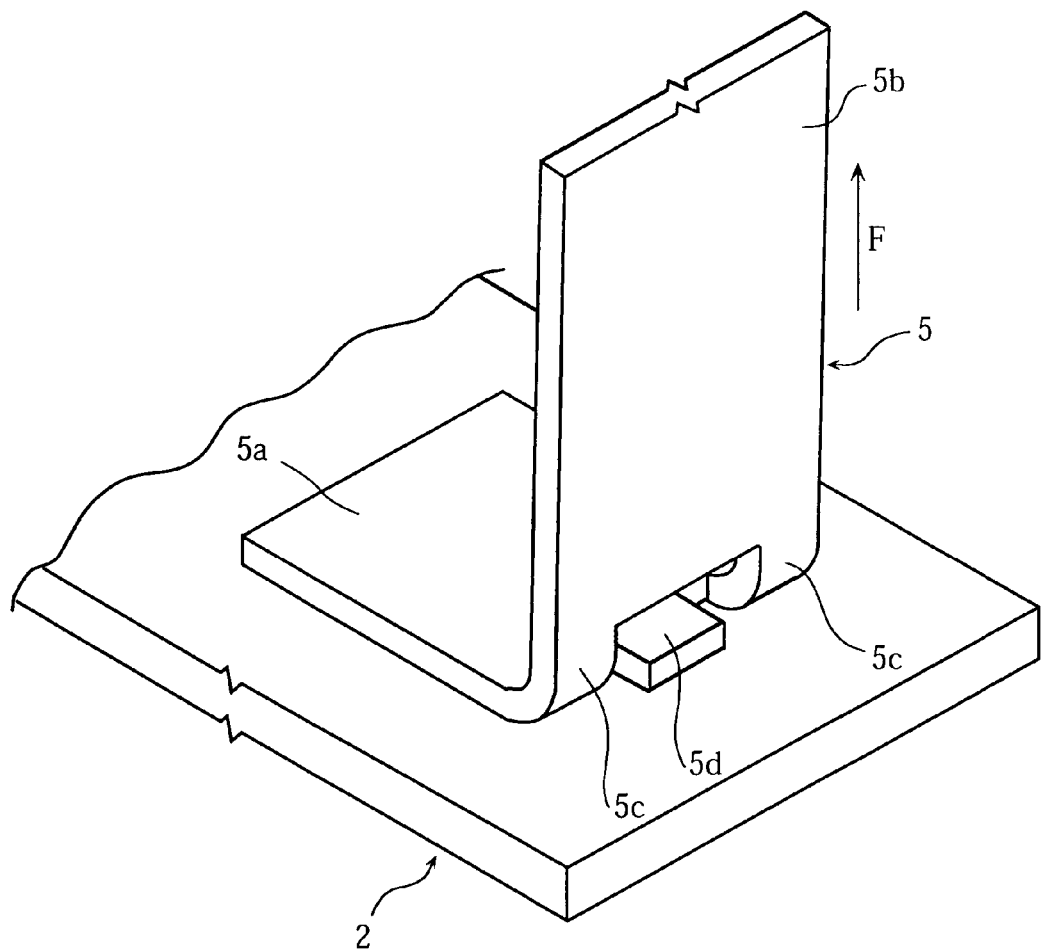
FIG. 4A illustrates how the conductor strip of the present invention can be stably attached to the substrate.
Figure 4B:
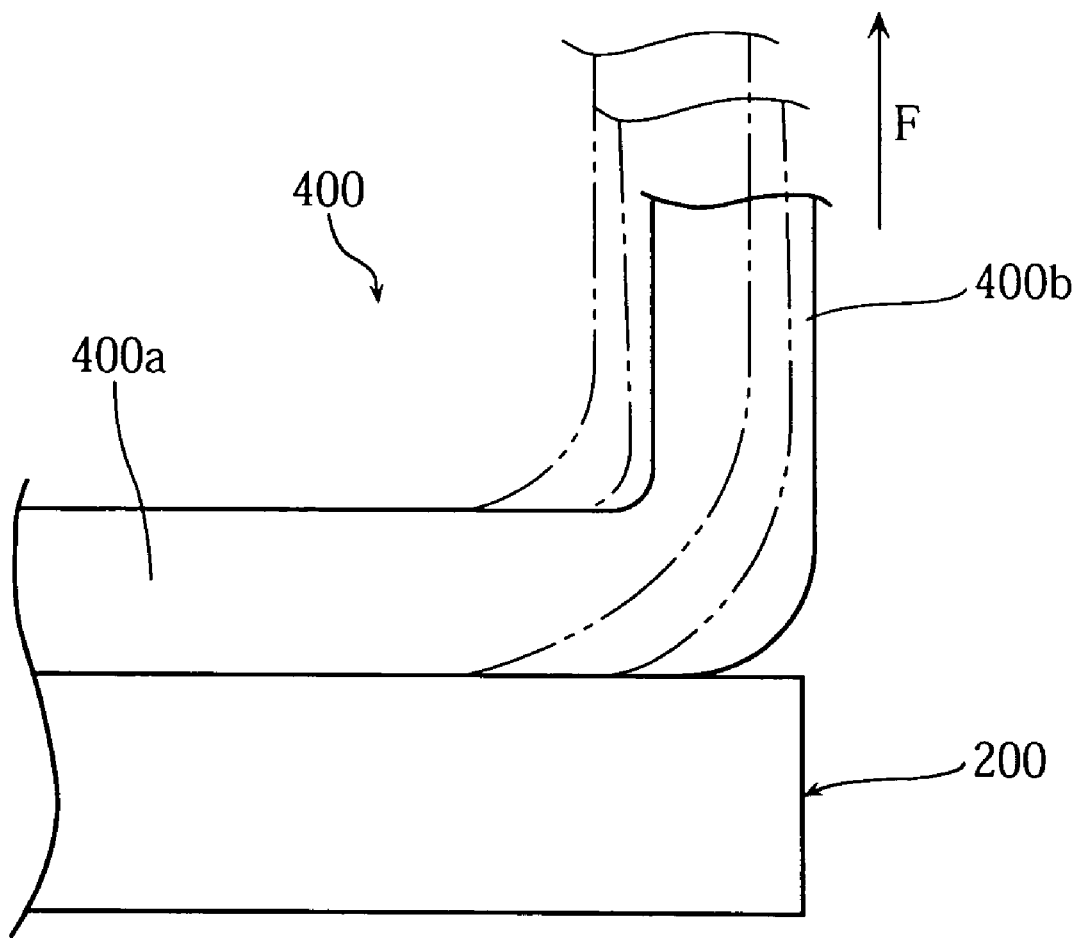
FIG. 4B illustrates how the conventional conductor strip is peeled off the substrate upon application of an upward external force.

The strip 5 of the present invention exhibits generally the same "PS-DP relation" as that of the conventional strip 400 when the distance of pull is about 0~0.6 mm (see FIG. 3). Then, when the distance of pull is about 0.6~1.6 mm (the range Sw in FIG. 3), the strip 5 is peeled off the substrate more easily than the conventional strip 400. The strip 5 exhibits the weaker peel strength because the peeling is proceeding with respect to the relatively narrow connecting portions 5c. Thereafter, the peel strength of the strip 5 becomes greater than that of the conventional strip 400. This is because the projection 5d of the strip 5 clings to the substrate 2, as shown in FIG. 4A, thereby serving as an additional resisting portion against the peeling force F.

Figure 5:
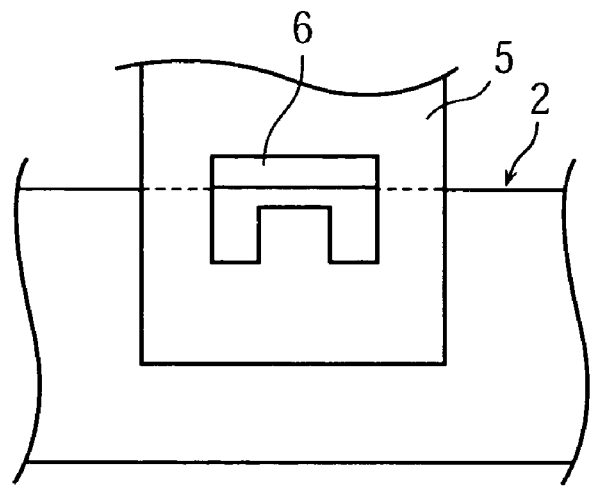
FIG. 5 shows a possible way to fix the conductor strip of the present invention to the substrate.
Figure 6:
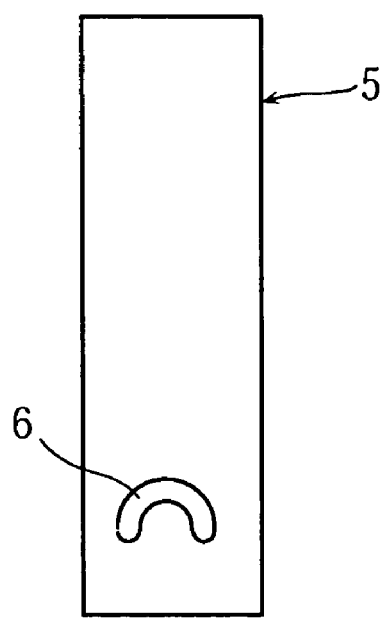
FIGS. 6 and 7 are a plan view showing a possible configuration of the slit formed in the conductor strip of the present invention.
Figure 7:
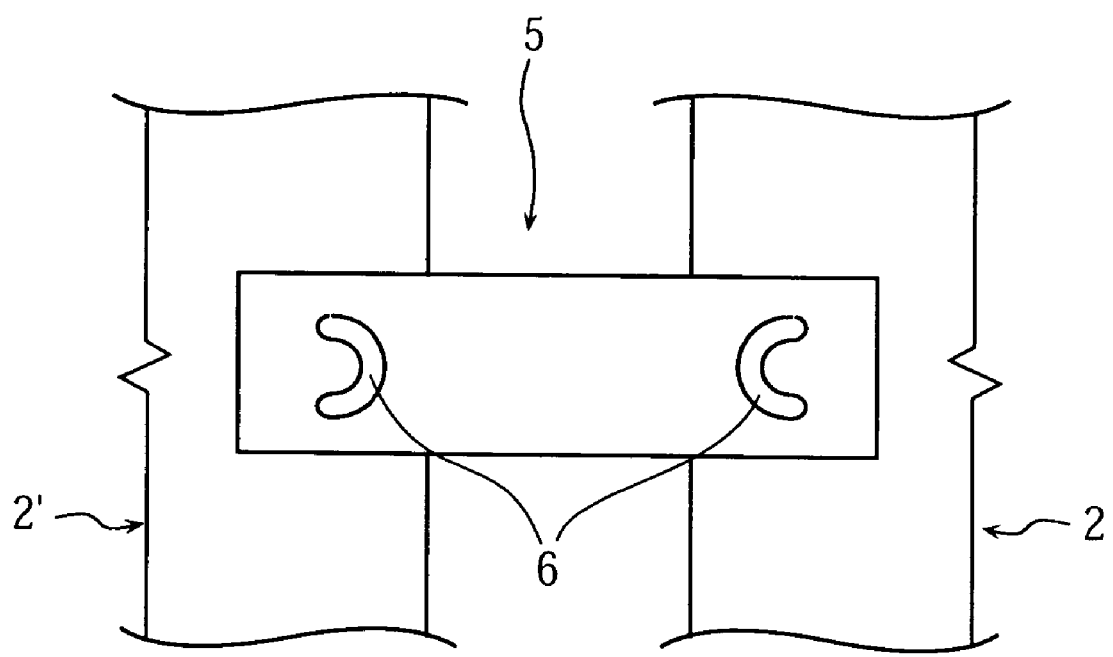

In the above-described embodiment, the strip 5 is supported by the substrate 2 so that the slit 6 as a whole is located on the substrate 2. The present invention is not limited to this, and the slit 6 may partially be off the substrate 2, as shown in FIG. 5. Further, the strip 6 may not have the staple-like, angular configuration, but have a smooth, arcuate (U-shaped) form, as shown in FIG. 6. Still further, the conductor strip 5 may be formed with two slits 6, as shown in FIG. 7. In the illustrated example, each of the two end portions of the strip 5 is formed with one slit 6 and connected to a substrate 2 or 2'.

Figure 8A:
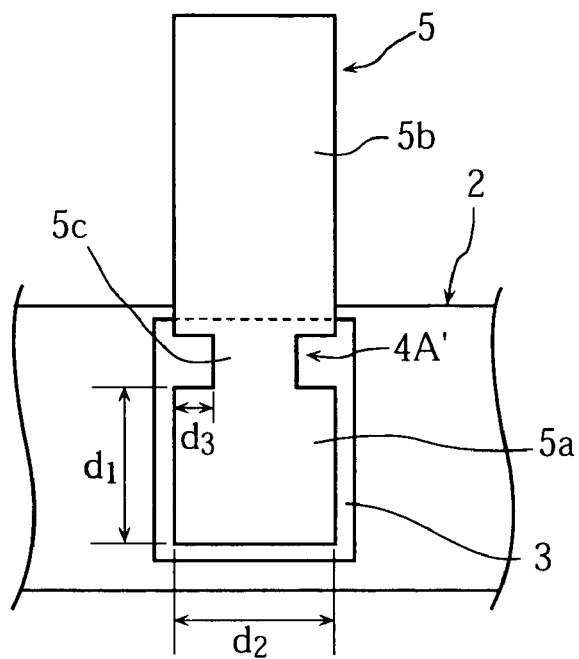
FIGS. 8A~8C are plan views showing how the conductor strip of a cutout-type can be mounted on the substrate.

FIG. 8A shows another possible configuration of the strip 5. In this embodiment, the first terminal 5a is formed with two rectangular cutouts spaced across a relatively narrow connecting portion 5c. With such an arrangement again, the remaining or disappearing of the linear region 8 (FIG. 2A) is observed through the rectangular cutouts. Thus, the quality inspection of the reflow soldering is readily performed. In the illustrated example, $d_1$ may be 3.0 mm, $d_2$ may be 3.0 mm, and $d_3$ may be 0.25~0.75 mm.

Figure 8B:
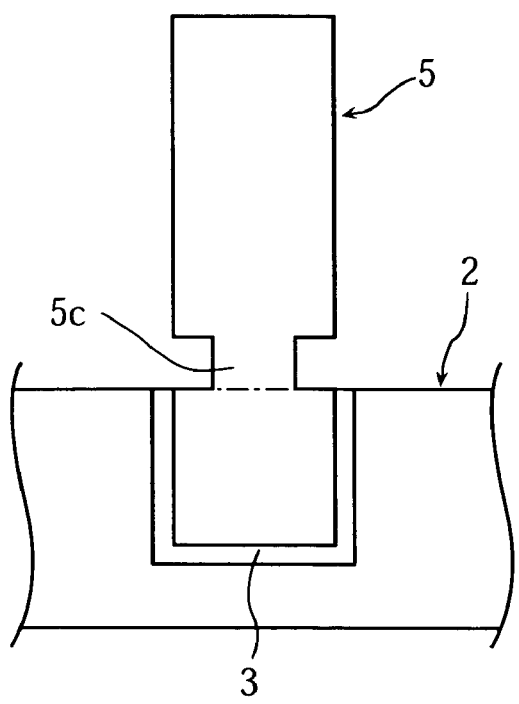
Figure 8C:
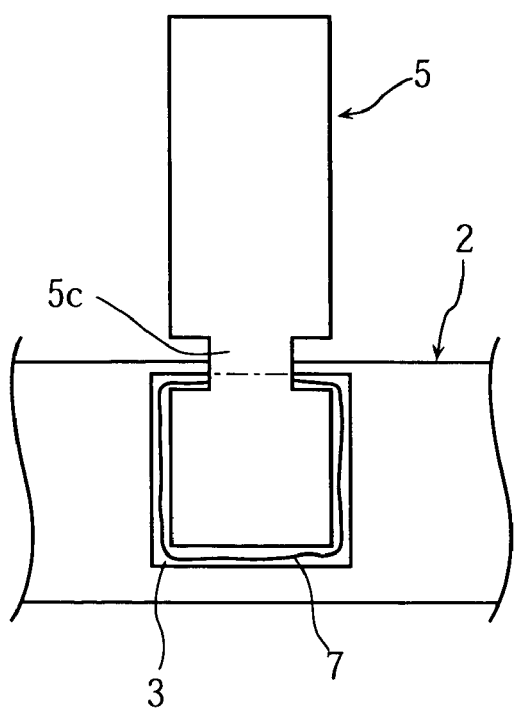

If the above inspection is not required, the strip 5 may be positioned so that the connecting portion 5c projects from the edge of the substrate 2 entirely as shown in FIG. 8B or partially as shown in FIG. 8C. The position of FIG. 8C is more advantageous to performing self-alignment of the strip 5 than that of FIG. 8B, since the molten solder 7 can enclose the connecting portion of the strip 5 more thoroughly.

Figure 9:
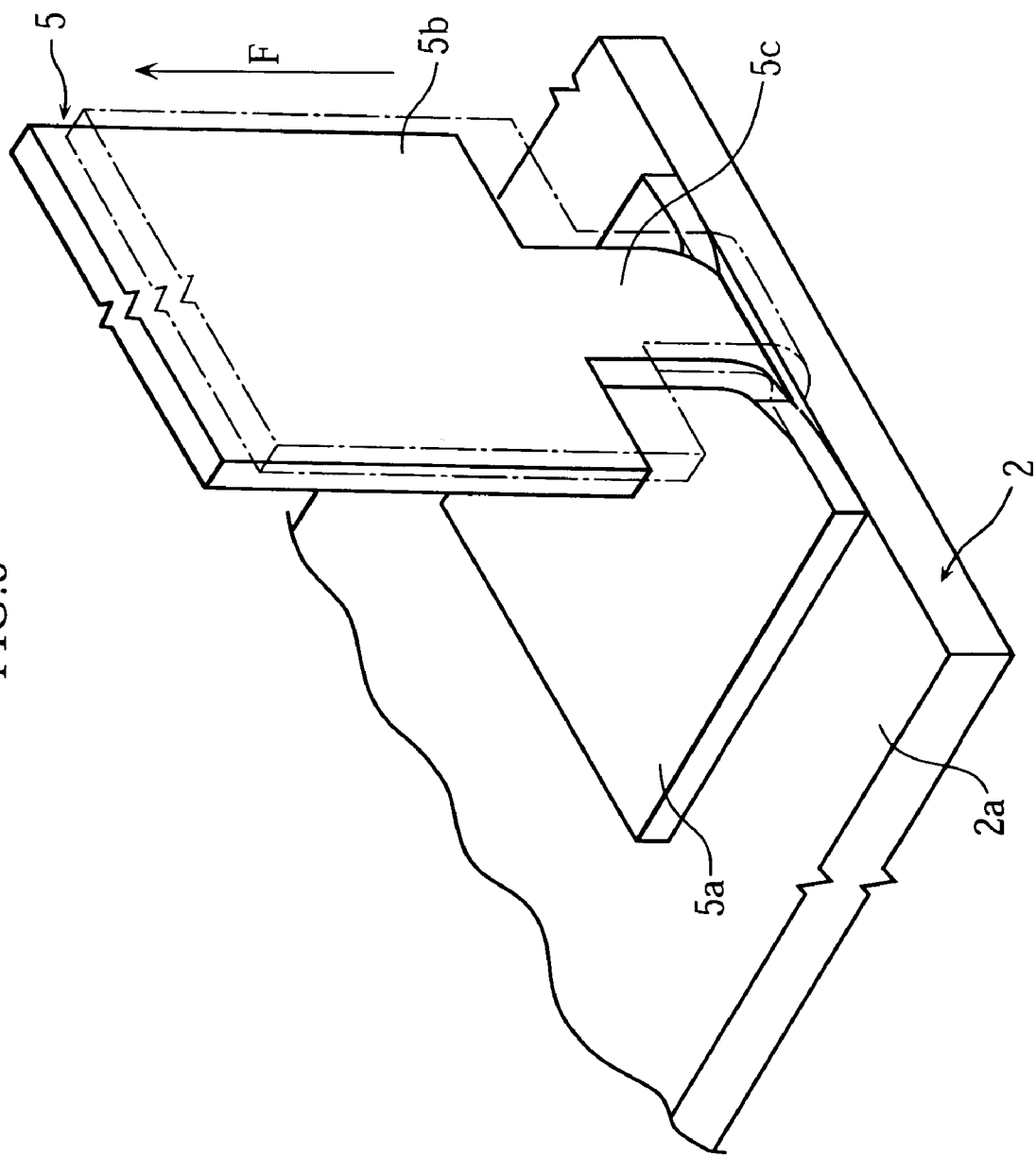
FIG. 9 illustrates the advantageous feature of the cutout-type conductor strip.
Figure 10:
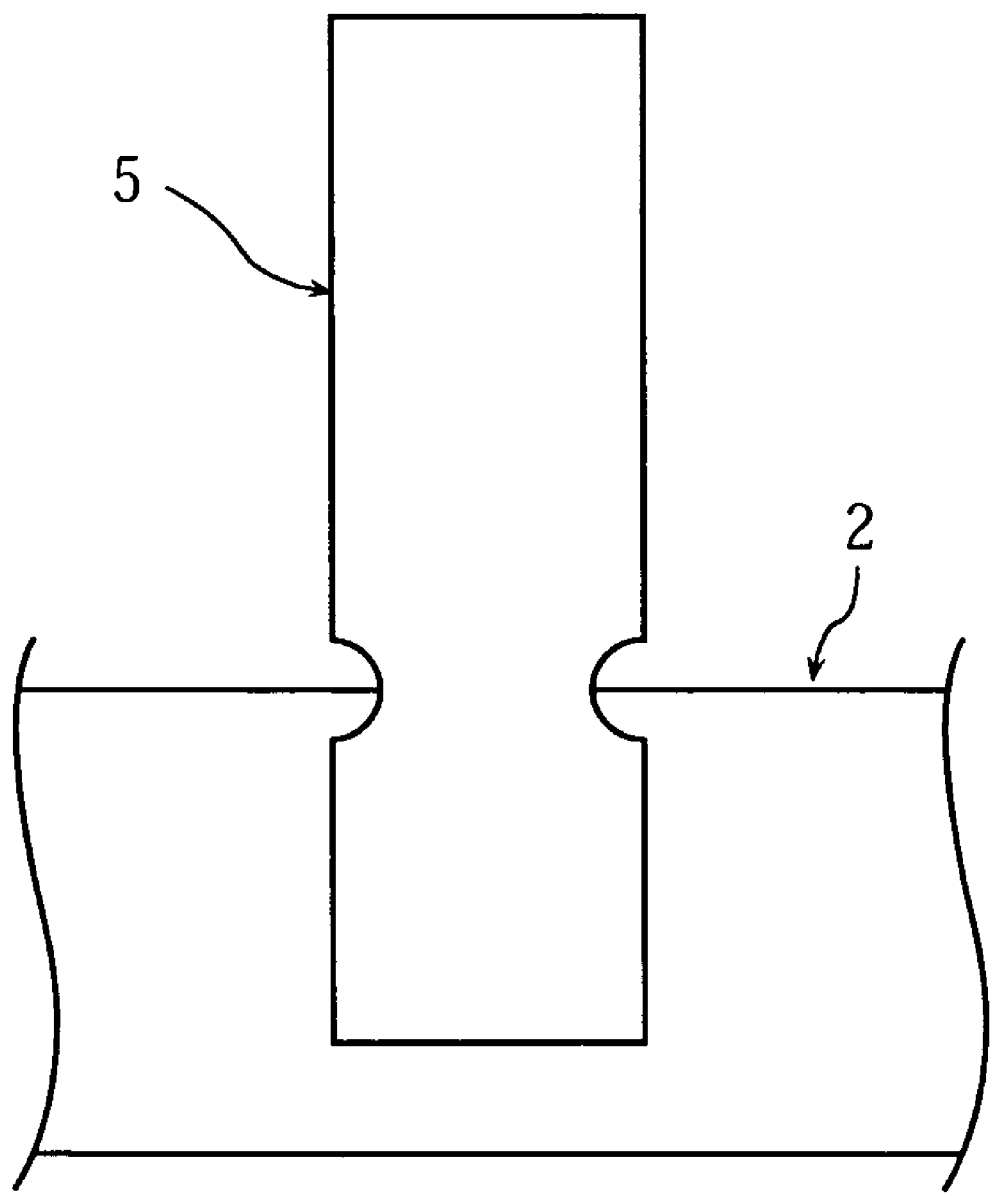
FIGS. 10 and 11A~11B are plan views showing other possible configurations of the cutout-type conductor strip.

Like the slit-forming arrangement described above, the cutout-forming arrangements of FIGS. 8A~8C contribute to the improvement of the peel strength of the strip 5. Referring to FIG. 9, when an upward external force F is exerted on the second terminal 5b, the first terminal 5a is about to be pulled upward. Differing from the prior art case (FIG. 16), the effect of the pulling force acts on the first terminal 5a via the relatively narrow connecting portion 5c. As a result, part of the external force F may be directed in the normal direction to the substrate surface 2a, which is the most effective direction for peeling off the first terminal 5a, while the other part of the external force F will act in slant directions to the substrate surface 2a, which are less effective peeling-off directions. Consequently, a greater external force is required to peel off the strip 5 than in the case of the conventional strip 400. The cutout formed in the strip 5 may be semicircular, as shown in FIG. 10.

Figure 11A:
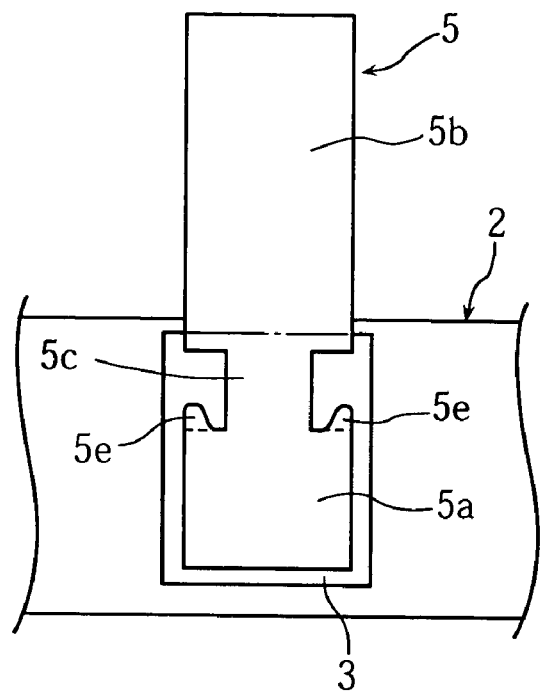
Figure 11B:
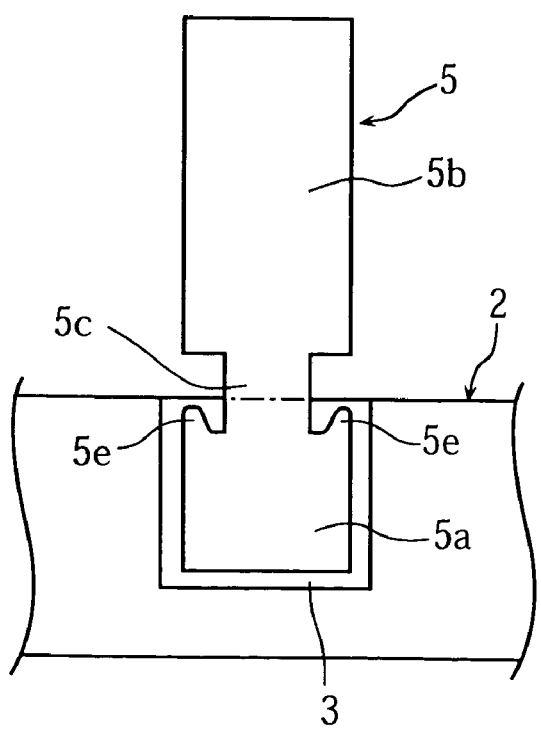
Figure 12:
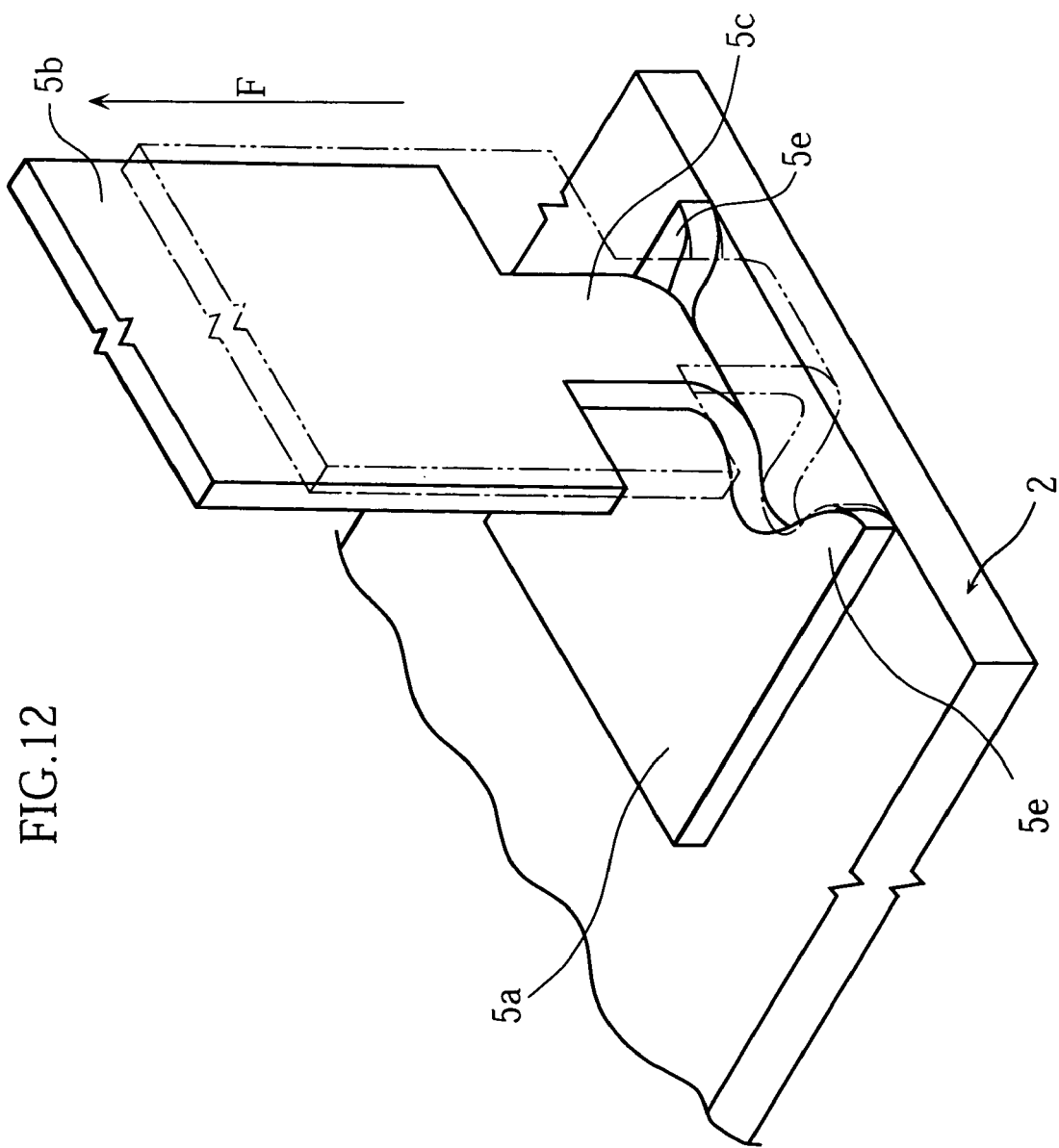
FIG. 12 illustrates the advantageous feature of the conductor strip shown in FIGS. 11A~11B.

According to the present invention, the first terminal 5a of the strip 5 shown in FIG. 8A may be provided with two protrusions 5e that extend from the first terminal 5a toward the second terminal 5b, as shown in FIG. 11A. With such an arrangement, the first terminal 5a is kept attached to the pad 3 more firmly than when only the narrow connecting portion 5c is provided between the first and the second terminals 5a, 5b. The reason is as follows. Referring to FIG. 12, when the upward external force F acts on the second terminal 5b, the pulling force is transmitted to the first terminal 5a via the narrower connecting portion 5c. Thus, as in the case described with reference to FIG. 9, the first terminal 5a is attached to the pad 3 more strongly than is conventionally possible. Further, according to the arrangement of FIG. 12, the projections 5e remain to be attached to the substrate 2 even after the connecting portion 5c is peeled off. Accordingly, the binding strength between the first terminal 5a and the substrate 2 is rendered much stronger. As shown in FIG. 11B, the connecting portion 5c may partially protrude from the edge of the substrate 2.

Figure 13A:
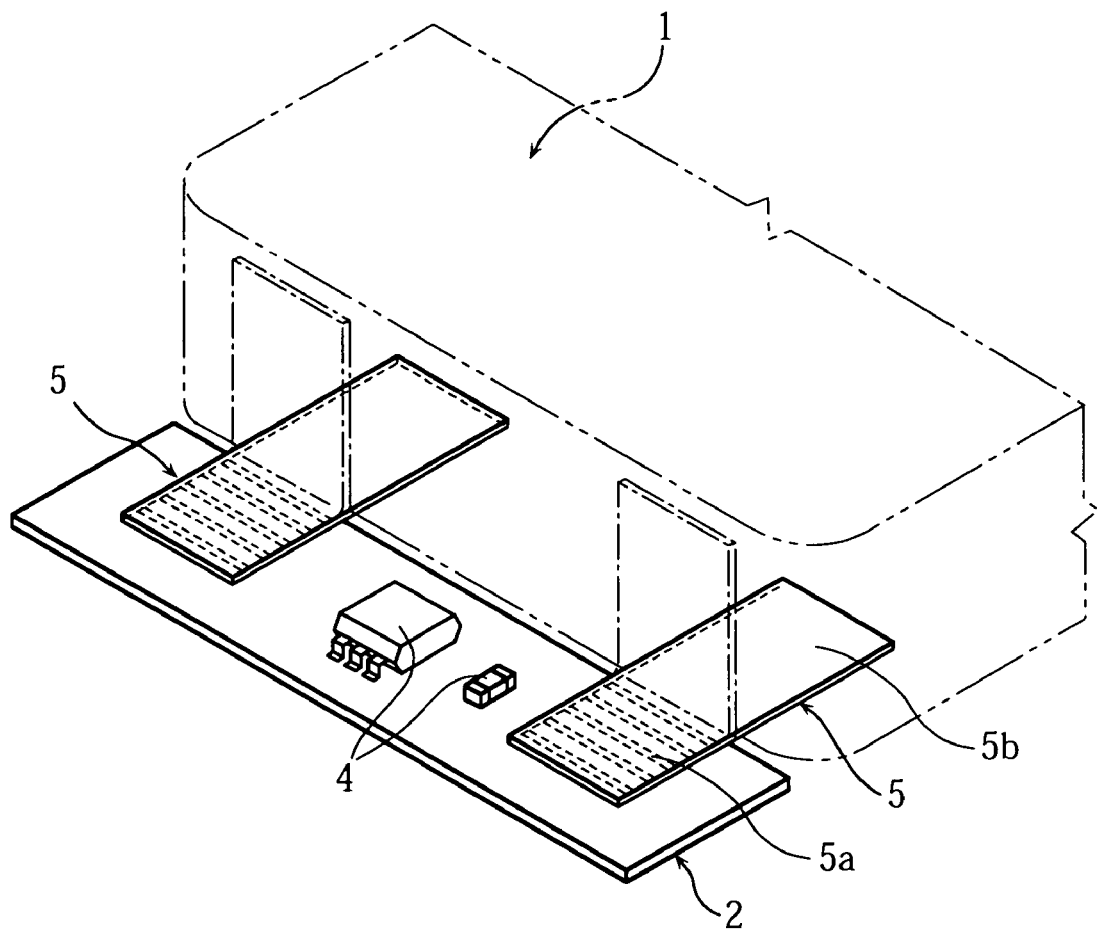
FIGS. 13A~13B illustrate a groove-type conductor strip of the present invention.
Figure 13B:
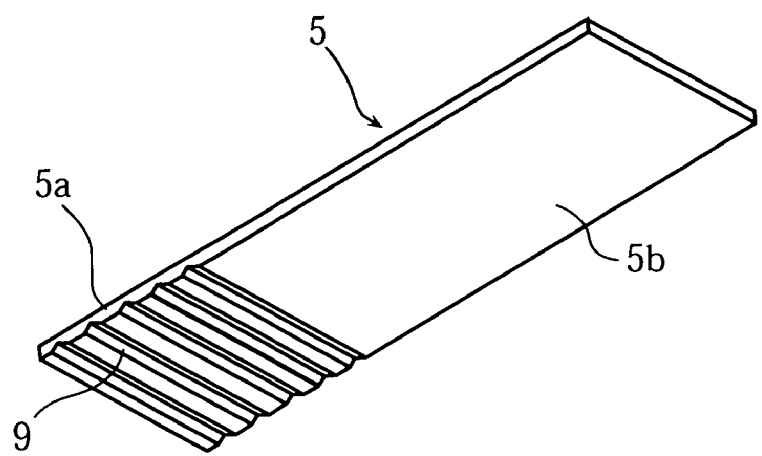
Figure 14:
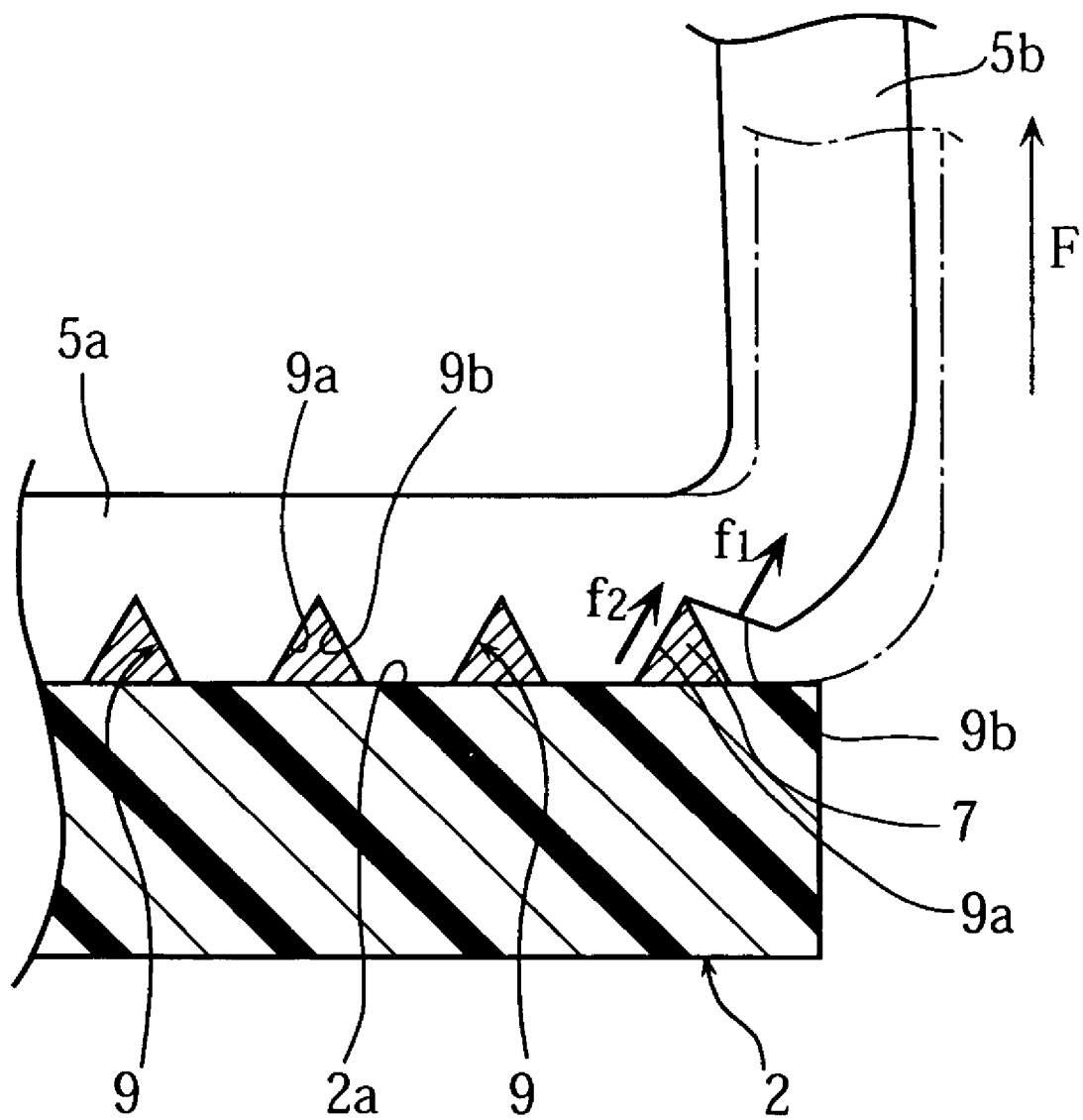
FIG. 14 illustrates the advantageous feature of the groove-type conductor strip.

According to another embodiment of the present invention, a plurality of grooves 9 may be formed on the bottom side of the first terminal 5a of each conductor strip 5, as shown in FIGS. 13A and 13B. In the illustrated example, each groove 9 extends widthways of the strip 5 and has a triangular cross section (see FIG. 14). In this arrangement, the molten solder material 7 fills the grooves 9, as shown in FIG. 14, and then hardens.

The above groove arrangement is advantageous to achieving reliable fixation of the strip 5 to the substrate 2. The reason is as follows. Referring to FIG. 14, the triangular configuration of each groove 9 is defined by a first slant surface 9a and a second slant surface 9b. When an upward external force F is exerted on the second terminal 5b of the strip 5, the second slant surface 9b of the rightmost groove 9 may be peeled off the solder material 7 rather readily because the peeling force $f_1$ acts in a direction generally perpendicular to the second slant surface 9b. After the second surface 9b is detached, a peeling force f2 is exerted on the first slant surface 9a. The acting direction of this force, however, is generally parallel to the first slant surface 9a, as seen from FIG. 14. Since the bonding force of the solder 7 is strong in this direction, the first terminal 5a can remain to be attached to the substrate 2 against a great external force.

Figure 15:
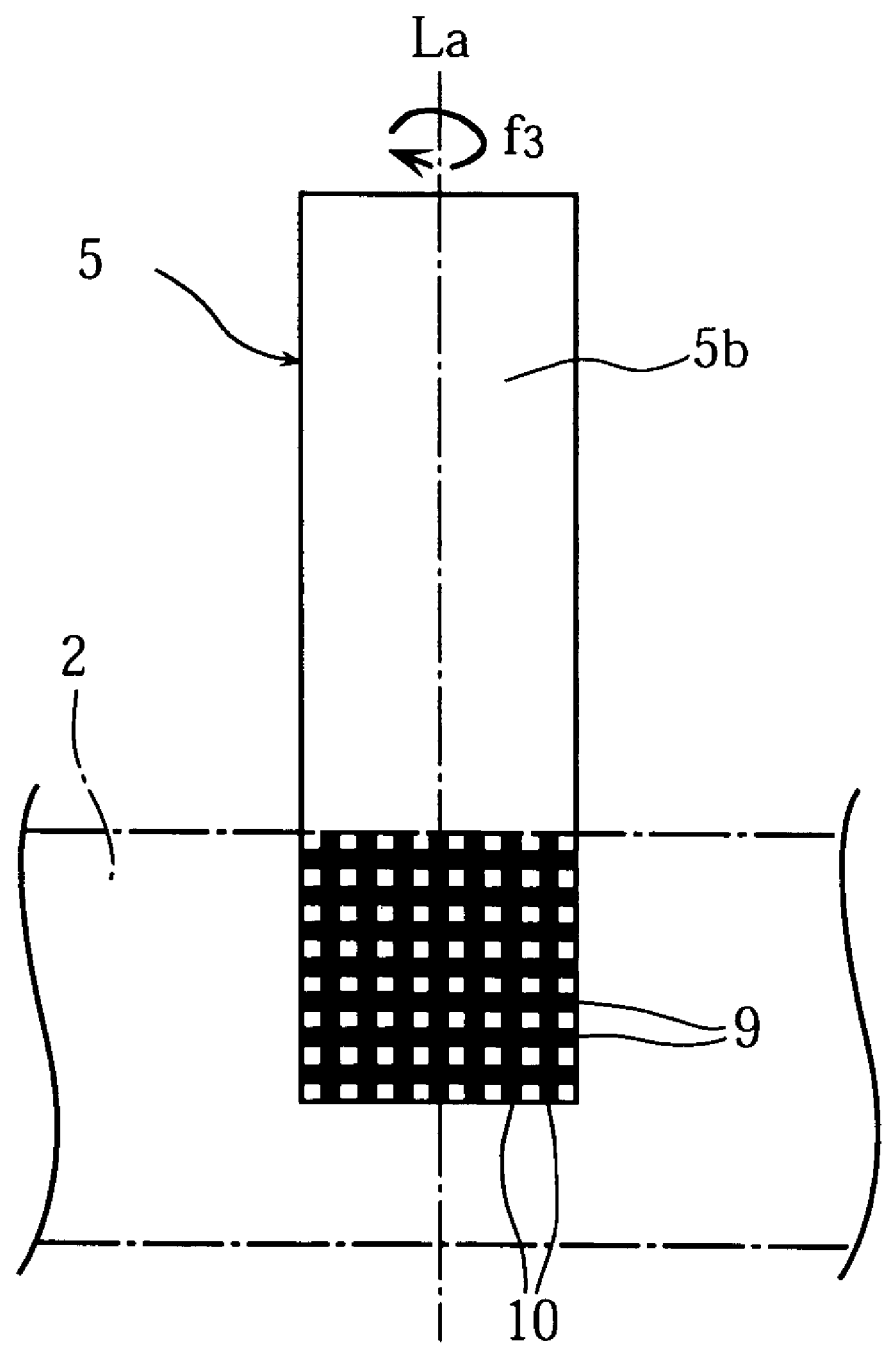
FIG. 15 shows a possible modification of the groove-type conductor strip.

As shown in FIG. 15, the conductor strip 5 may additionally be formed with a plurality of grooves 10 extending longitudinally of the strip 5. With such an arrangement, the strip 5 can remain to be attached to the substrate 2 upon application of a rather great torsional force $f_3$ about the longitudinal axis La.

According to the present invention, the grooves 9 may not be straight or have a triangular cross section.

The grooves 9 and/or 10 may be formed in the conductor strip shown in FIGS. 1A, 6, 7, 8A~8C, 10 or 11A~11B.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. An assembly comprising a substrate and a conductor strip connected to the substrate,
   wherein the conductor strip includes a first end portion fixed to the substrate, and a second end portion opposite to the first end portion,
   wherein the first end portion is formed with a plurality of cutouts, and
   wherein each of the cutouts extends out beyond an edge of the substrate.

2. The assembly according to claim 1, wherein the first end portion of the conductor strip is formed with a projection extending at each of the cutouts toward the second end portion.

* * * * *